US012567468B2

(12) United States Patent
Lien et al.

(10) Patent No.: US 12,567,468 B2
(45) Date of Patent: Mar. 3, 2026

(54) PASS VOLTAGE ADJUSTMENT FOR PROGRAM OPERATION IN A MEMORY DEVICE WITH A DEFECTIVE DECK

(71) Applicant: MICRON TECHNOLOGY, INC., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 18/524,694

(22) Filed: Nov. 30, 2023

(65) Prior Publication Data

US 2024/0185924 A1     Jun. 6, 2024

Related U.S. Application Data

(60) Provisional application No. 63/429,639, filed on Dec. 2, 2022.

(51) Int. Cl.
| | |
|---|---|
| *G11C 16/04* | (2006.01) |
| *G11C 16/10* | (2006.01) |
| *G11C 16/26* | (2006.01) |
| *G11C 16/34* | (2006.01) |

(52) U.S. Cl.
CPC .......... *G11C 16/10* (2013.01); *G11C 16/0483* (2013.01); *G11C 16/26* (2013.01); *G11C 16/3459* (2013.01)

(58) Field of Classification Search
CPC ..... G11C 16/10; G11C 16/0483; G11C 16/26; G11C 16/3459; G11C 11/5628; G11C 16/08

USPC ...................................................... 365/185.18
See application file for complete search history.

(56) References Cited

U.S. PATENT DOCUMENTS

| | | | |
|---|---|---|---|
| 10,325,665 B2 * | 6/2019 | Fastow | ............... G11C 11/4074 |
| 10,354,737 B2 * | 7/2019 | Hu | ........................ G11C 16/349 |
| 11,049,578 B1 * | 6/2021 | Murai | ................ G11C 16/3486 |
| 11,315,647 B2 | 4/2022 | Chiang et al. | |
| 11,804,268 B2 * | 10/2023 | Park | .................... G06F 13/1668 |
| 2019/0043594 A1 | 2/2019 | Zhao et al. | |
| 2019/0392893 A1 | 12/2019 | Yang et al. | |
| 2021/0343351 A1 | 11/2021 | Chiang et al. | |
| 2022/0334902 A1 | 10/2022 | Li et al. | |

* cited by examiner

*Primary Examiner* — Tha-O H Bui
(74) *Attorney, Agent, or Firm* — Lowenstein Sandler LLP

(57)     ABSTRACT

A system includes a memory device and a processing device, operatively coupled with the memory device, to perform operations including: receiving a request to perform a program operation on a set of cells associated with a wordline in a block of the memory device; determining whether at least one second deck is physically disposed below at least one first deck, wherein the at least one first deck satisfies a criterion pertaining to a functionality of a deck, and the at least one second deck does not satisfy the criterion; and responsive to determining that the at least one second deck is physically disposed below the at least one first deck, performing the program operation on the set of cells using a first pass voltage applied during a program verify phase, wherein the first pass voltage is lower than a default program verify pass voltage.

20 Claims, 8 Drawing Sheets

| ADJUSTMENT TABLE 300A | | | | | | |
|---|---|---|---|---|---|---|
| Wordline 301 | Block ID 302 | Block Indicator 303 | Deck ID 304 | Deck Indicator 305 | Adjustment Indicator 306 | PV Vpass 310 |
| WL1 | B1 | HGB1 (HGB) | D1 | FD | Y | V1 |
| WL4 | B1 | HGB1 (HGB) | D2 | DD | N | V0 |
| ... | ... | HGB2 (HGB) | ... | DD | N | V0 |
| ... | ... | FB | ... | FD | Y | V2 |
| ... | ... | HGB2 (HGB) | ... | DD | N | V0 |
| WL6 | B2 | DB | D1 | DD | N | V0 |
| ... | ... | ... | ... | ... | ... | ... |

300B

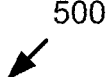

500

Receive a request to perform a program operation on a set of memory cells that are associated with a wordline in a block of a memory device, wherein the block comprising a plurality of decks
510

Determine whether at least one first deck of the plurality of decks satisfies a criterion pertaining to a functionality of a deck and at least one second deck of the plurality of decks does not satisfy the criterion
520

Responsive to determining that at least one first deck of the plurality of decks satisfies the criterion and at least one second deck of the plurality of decks does not satisfy the criterion, determine whether at least one second deck is disposed below at least one first deck
530

Responsive to determining that the at least one second deck is disposed below the at least one first deck, performing the program operation on the set of cells associated with the wordline using a first pass voltage applied during the program verify phase, wherein the first pass voltage is lower than a default pass voltage.
540

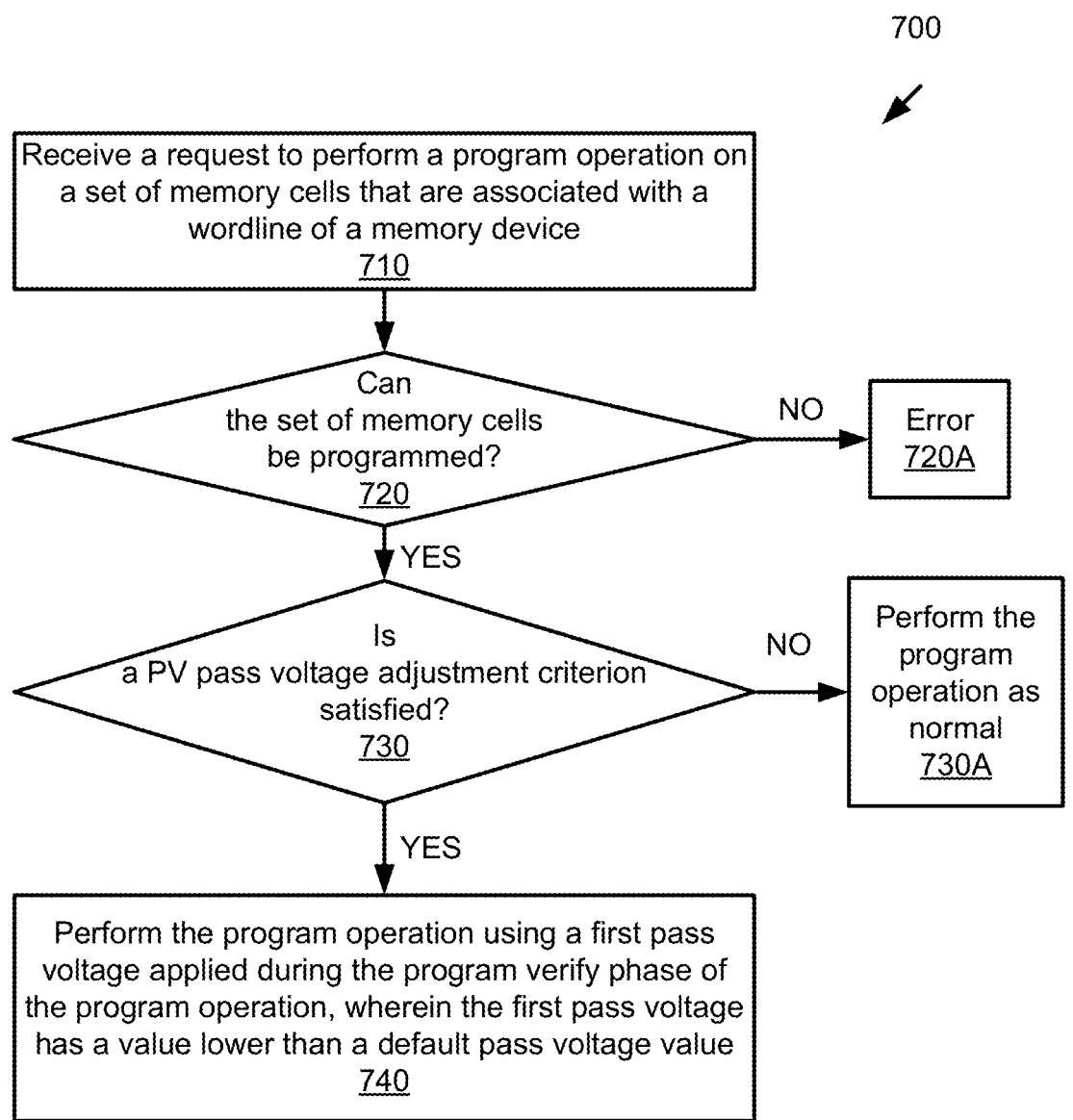

Receive a request to perform a program operation on a set of memory cells that are associated with a wordline of a memory device
710

Can the set of memory cells be programmed?
720

NO → Error 720A

YES

Is a PV pass voltage adjustment criterion satisfied?
730

NO → Perform the program operation as normal 730A

YES

Perform the program operation using a first pass voltage applied during the program verify phase of the program operation, wherein the first pass voltage has a value lower than a default pass voltage value
740

FIG. 7

PASS VOLTAGE ADJUSTMENT FOR PROGRAM OPERATION IN A MEMORY DEVICE WITH A DEFECTIVE DECK

RELATED APPLICATIONS

This application claims the benefit of U.S. Provisional Patent Application No. 63/429,639, filed Dec. 2, 2022, the entire contents of which are incorporated by reference herein.

TECHNICAL FIELD

Embodiments of the disclosure relate generally to memory sub-systems, and more specifically, relate to adaptive adjustment of pass voltages applied during a program verify phase of a program operation for wordlines in a memory device having both defective and functional decks in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 5-7 are flow diagrams illustrating examples of methods to implement adaptive adjustment of pass voltages applied during a program verify phase of a program operation for wordlines in a memory device having both defective and functional decks in a memory sub-system, in accordance with some embodiments of the present disclosure.

DETAILED DESCRIPTION

Figure 1:
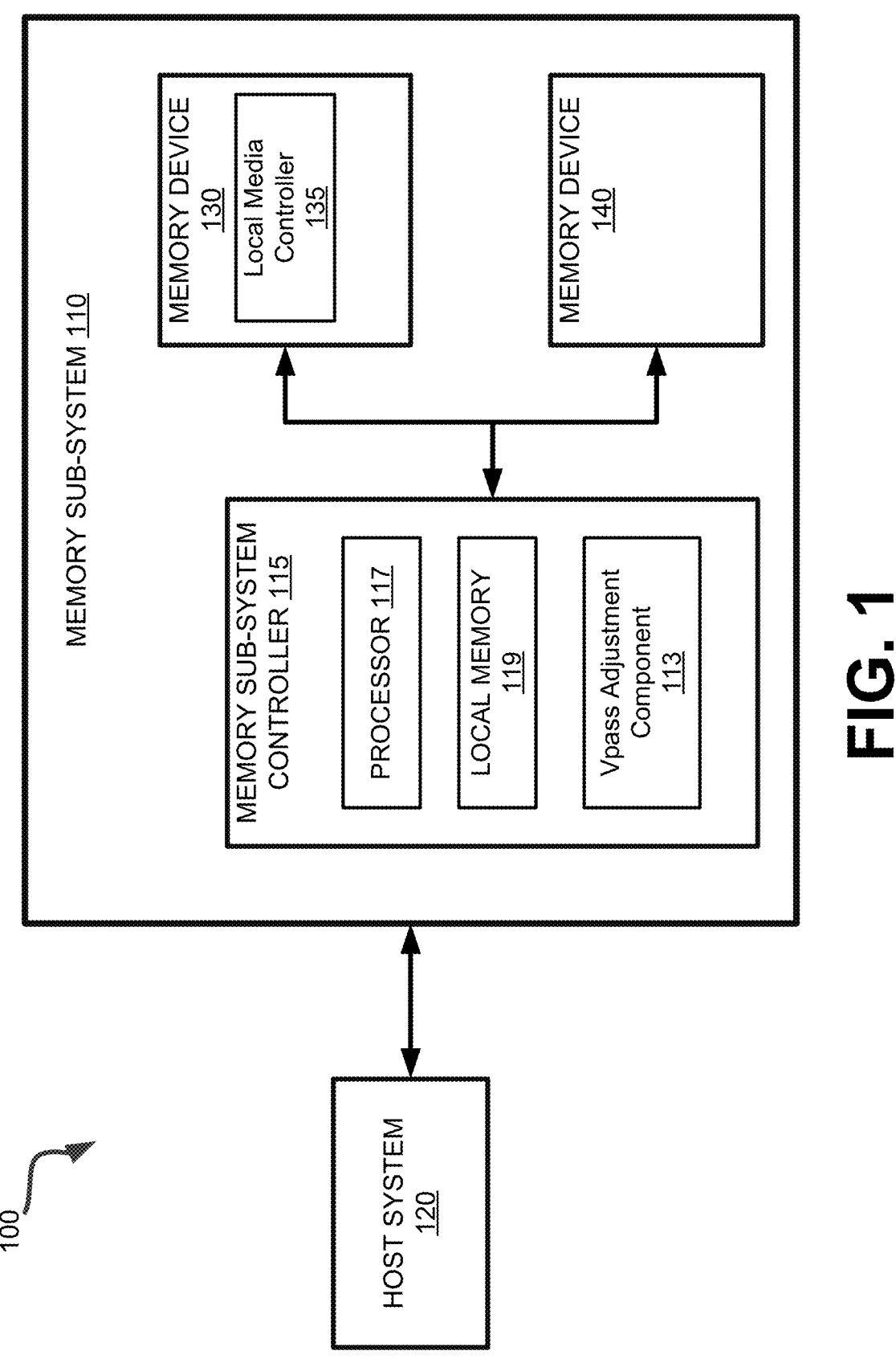
FIG. 1 illustrates an example computing system that includes a memory sub-system, in accordance with some embodiments of the present disclosure.

Aspects of the present disclosure are directed to adaptive adjustment of pass voltages applied during a program verify phase of a program operation for wordlines in a memory device having both defective and functional decks in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and a wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ can be fit into the working range allowing for storage and reliable detection of multiple values of the charge $Q_k$, $k=1, 2, 3 \ldots$. The distributions are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

During a read operation, a read reference voltage is applied to the wordline containing the data to be read, while a pass through voltage is applied to wordlines of unread memory cells. The pass through voltage is a read reference voltage higher than any of the stored threshold voltages. However, when data is read from a memory cell of the memory sub-system, nearby or adjacent wordlines can experience deterioration via, for example, read disturb, slow charge loss, etc. Read disturb is a phenomenon in NAND memory where reading data from a memory cell can cause the threshold voltage of unread memory cells in the same block to shift to a different value. Slow charge loss is a phenomenon where threshold voltage of a memory cell changes in time as the electric charge of the memory cell is degrading, which is referred to as "temporal voltage shift"

(since the degrading electric charge causes the voltage distributions to shift along the voltage axis towards lower voltage levels). The threshold voltage is changing rapidly at first (immediately after the memory cell was programmed), and then the change slows down in an approximately logarithmic linear fashion with respect to the time elapsed since the cell programming event. Accordingly, failure to mitigate the temporal voltage shift caused by the slow charge loss can result in the increased bit error rate in read operations.

Manufacturing parameters can also affect the rate of memory cell deterioration. In particular, each die of a memory device can have different electrical and physical characteristics due to process variation during manufacturing, such as temperature, supply voltage, etc. This "die-to-die variability" results in different error rates for different die subjected to the same operational conditions. For example, the worst page (e.g., page with the highest error rate on a die) on one die of the memory device can have twice the error rate of the worst page of another die of the memory device, where both dies were programmed at the same time.

Some memory devices, such as three-dimensional (3D) cross-point devices, can include multiple portions. A portion, such as a deck or layer, can be defined as a two-dimensional (2D) array of memory cells electronically addressable by a vertical access line(s) (e.g., wordline(s)). Multiple decks can be stacked within a memory device (e.g., stacked vertically). As the wordlines increase in layers, the likelihood of defects in the wordlines increases. The defects may include wordline-to-wordline short, and/or open wordline. For example, open wordline indicates that a void occurs during cycling degradation and voltage signals cannot be achieved from the row decoder. This defect can occur at wordline plane, staircase connection or anywhere along the signal path. As another example, an electrical short can develop between two adjacent wordlines, and when a certain voltage, such as a program voltage, is applied to one of those wordlines, a current is developed, at least a portion of which can flow through the electrical short and onto the adjacent wordline. This portion of the current can be referred to as a "leakage current" and the electrical short can be referred to as a "wordline-to-wordline short." This leakage current can impact the logical values programed to or read from the memory cells connected to the associated wordlines leading to errors on the memory device. For example, a wordline-to-wordline short can cause a current (e.g., during a write operation applied to the selected wordline) to discharge some electrons to the wordline adjacent to the wordline being programmed. This results in the write operation failing to program data on the selected wordline, as well as the data on the adjacent wordline being corrupted.

Therefore, in some cases, some decks of the memory device have the defect that makes the decks unusable, while other decks of the memory device can still function well. For example, in a memory device that has two decks, one or more defective wordlines in one deck may make the deck un-useful ("defective"), while the other deck still can be used to store data and can be deemed as useful ("functional"). Such a "half good" memory device may be put in use by having the defective deck in an erase state. A "half good" memory device can be a memory device (or any unit of the memory device) having at least one functional deck and at least one defective deck. As such, it is better to maintain the defective deck in an erase state. For example, if the defective deck is an upper deck in a two-deck memory device, the upper deck will be kept in the erase state and the bottom deck will be used as normal. Thus, there is a corresponding erase scheme for the "half good" memory device, for example, so that the defective deck will not be re-erased that can affect the threshold voltage distribution. For example, an erase scheme may include preprogram before applying the erase pulse to make the cells voltage more uniform after applying the erase pulse. This preprogram will apply a program pulse to all wordlines. However, for "half good" memory device, the erase scheme will not have preprogram applied on defect deck as well as the erase pulse.

However, there is no special read scheme for the "half good" memory device. For example, in a read operation, a pass through voltage used for normal memory device (i.e., a memory device with all decks functional) is applied to the "half good" memory device. It can result in more overdrive, higher string current and shift in the threshold voltage distribution and, in turn, increase the error rate (e.g., raw bit error rate (RBER)). Because there exist various methods for read level adjustment (e.g., wordline group (WLG), temperature compensation, compensation over program erase cycles, block family error avoidance (BFEA)), a special read scheme for the "half good" memory device would further complicate the read level adjustment.

Aspects of the present disclosure address the above and other deficiencies by implementing adaptive adjustment of pass voltages applied during a program verify phase of a program operation (also referred to as "PV pass voltages") for wordlines in a memory device having both defective and functional decks in a memory sub-system. Implementing adaptively adjusted PV pass voltages can be used to reduce the string current during a program operation for wordlines in a memory device having both defective and functional decks and can compensate for a threshold voltage distribution shift caused by the defective decks compared with a memory device having all functional decks.

To implement adaptively adjusted PV pass voltages for wordlines in a memory device having both defective and functional decks in a memory sub-system as described herein, a memory sub-system controller can receive a request to perform a program operation (including a program phase and a program verify phase) on a set of memory cells that are associated with a wordline of a memory device. The memory sub-system controller can determine whether the memory device in which the wordline is disposed is a memory device that has both defective and functional decks. In response to determining that the memory device in which the wordline is disposed is a memory device having both defective and functional decks, the memory sub-system controller can determine whether the memory device is a type of the memory device where at least one defective deck is physically disposed below at least one functional deck. In response to determining that memory device is a type of the memory device where at least one defective deck is physically disposed below at least one functional deck, the memory sub-system controller can perform the program operation on the set of memory cells connected to the wordline using a PV pass voltage, where the PV pass voltage is lower than a default PV pass voltage. The memory sub-system controller can retrieve the PV pass voltage using a data structure stored on the memory device that associates respective wordlines in entries of the data structure. In some embodiments, the PV pass voltage can be predetermined at manufacturing of the memory device based on offline testing and media characterization of the memory device under various testing conditions. In some embodiments, the PV pass voltage can be determined during the lifetime usage of the memory device based on online testing and media characterization of the memory device under various testing conditions. In some embodiments, the PV pass voltage can be tested with a specific wordline and used only with that wordline. In some embodiments, the PV pass voltage can be tested with a representative wordline from a group of wordlines and used for any wordline from the group. The PV pass voltage can be varied based on different cell types (e.g., SLC, MLC, TLC, or QLC), different cell levels (L1, L2, etc.), and/or different wordlines (WL1, WL2, etc.)

Take a block, as a unit of the memory device that can be applied to the present disclosure, as an example, a block of the memory device according to the present disclosure has at least two decks. A functional deck refers to a deck that satisfies a criterion pertaining to a functionality of a deck, for example, a metric of the deck (e.g., an average RBER) does not exceed a threshold value that is considered as an indication of a functionality normality of the deck. A defective deck refers to a deck that does not satisfy a criterion pertaining to a functionality of a deck, for example, a metric of the deck (e.g., an average RBER) exceeds a threshold value that is considered as an indication of a functionality normality of the deck. The criteria used for the functional deck and the defective deck can be the same or different. In some implementations, a defective deck may be identified by program status failure. For example, either voltages applied in the program phase reaches the max voltage setting (e.g., pre-defined value), or program loops hit the max loops setting (e.g., pre-defined values).

A block can be a full block, a defective block, or a half good block (HGB). A full block refers to a block that has only functional decks. A defective block refers to a block that has only defective decks. A half good block (HGB) refers to a block that has at least one functional deck and at least one defective deck. A half good block (HGB) can be a type-I HGB (HGB1) or a type-II HGB (HGB2). HGB1 refers to a HGB where at least one defective deck would be programed after at least one functional deck being programmed, that is, in most cases, where at least one defective deck is physically disposed below at least one functional deck. HGB2 refers to a HGB where any defective deck would be not programed after any functional deck being programmed, that is, in most cases, where there is no defective deck physically disposed below any functional deck. For example, for a two-deck block, HGB1 represents a functional deck physically disposed above a defective deck (F-D) block; HGB2 represents a defective deck physically disposed above a functional deck (D-F) block. For a three-deck block, HGB1 represents a D-F-D block, a F-D-D block, a F-D-F block, or a F-F-D block, where "F" stands for a functional deck, "D" stands for a defective deck, and "-" stands for (its left-side item) being physically disposed above (its right-side item); and HGB2 represents a D-D-F block or a D-F-F block.

In some embodiments, the memory sub-system controller can receive a request to perform a program operation (including a program phase and a program verify phase) on a set of memory cells that are associated with a wordline in a block of a memory device. The memory sub-system controller can check whether the set of memory cells has already been programmed (e.g., operation 620), or whether the set of memory cells is disposed in a defective deck that cannot be programmed (e.g., operation 640). If it is determined that either the set of memory cells has already been programmed or the set of memory cells is disposed in a defective deck that cannot be programmed, the memory sub-system controller can return an error message in response to the request. If it is determined that the set of memory cells can be programmed, the memory sub-system controller can determine whether to perform an adjustment on PV pass voltages.

In some embodiments, to determine whether to adjust PV pass voltages, the memory sub-system controller can determine whether the set of memory cells is disposed in a HGB. For example, the memory sub-system controller can use a data structure, such as a mapping table, to identify a block to which the wordline is mapped based on the address of the wordline, and then use another data structure, such as part of a table illustrated in FIG. 3A, to check a block indicator with which the identified block is associated to determine whether the block is a HGB.

If the memory sub-system controller determines that the set of memory cells is disposed in a HGB, the memory sub-system controller can determine whether the HGB is a HGB1. For example, the memory sub-system controller can use a data structure, such as a mapping table, to identify the decks associated with the HGB and can identify the relative positions of the decks based on the physical addresses of the decks. The memory sub-system controller can use another data structure, such as part of a table illustrated in FIG. 3A, to check a deck indicator with which each of the identified decks is associated, and with the relative positions of the decks to determine whether at least one defective deck is physically disposed below at least one functional deck. If the memory sub-system controller determines that the set of memory cells is not disposed in a HGB, the memory sub-system controller can determine to not adjust PV pass voltage and thus perform the program operation as normal.

In some embodiments, to determine whether to adjust PV pass voltages, the memory sub-system controller can directly determine whether the set of memory cells is disposed in a HGB1. For example, the memory sub-system controller can use a data structure, such as a mapping table, to identify a block to which the wordline is mapped based on the address of the wordline, and then use another data structure, such as part of a table illustrated in FIG. 3A, to check a block indicator with which the identified block is associated to determine whether the block is a HGB1.

In some embodiments, to determine whether to adjust PV pass voltages, the memory sub-system controller can determine whether a PV pass voltage adjustment criterion is satisfied. For example, the memory sub-system controller can use a data structure, such as part of a table illustrated in FIG. 3A, to check an adjustment indicator with which the wordline is associated to determine whether to adjust PV pass voltages.

In all above cases, in response to determining to not adjust PV pass voltages, the memory sub-system controller can perform, as normal, the program operation on the set of memory cells connected to the wordline. In response to determining to adjust PV pass voltages, the memory sub-system controller can perform the program operation on the set of memory cells connected to the wordline using a PV pass voltage, where the PV pass voltage is lower than a default PV pass voltage. The memory sub-system controller can retrieve the PV pass voltage using a data structure stored on the memory device that associates respective wordlines in entries of the data structure. In some embodiments, the PV pass voltage can be predetermined at manufacturing of the memory device based on offline testing and media characterization of the memory device under various testing conditions. In some embodiments, the PV pass voltage can be determined during the lifetime usage of the memory device based on online testing and media characterization of the memory device under various testing conditions. Further details regarding implementing adaptive adjustment of pass voltages applied during a program verify phase of a program operation for wordlines in a memory device having both defective and functional decks in a memory sub-system are described herein below with reference to FIGS. 1-8. Although the block is illustrated as a unit of the memory device that the present disclosure applies on, any other unit of the memory cell can be also appliable as long as it has multiple decks. For each block or other unit of the memory cell, the determination of the PV pass voltage can be independent.

Advantages of the present disclosure include, but are not limited to, improved memory device performance and reliability. For example, implementing adaptively adjusted PV pass voltages can lower the error rate without contributing the complexity of read level optimization and without program time and read time penalty. Thus, the reliability of the wordlines in a memory device that has both defective and functional decks can be improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processors.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an Vpass adjustment component 113 that can be used to implement adaptive adjustment of pass voltages applied during a program verify phase of a program operation for wordlines in a memory device having both defective and functional decks in a memory sub-system, in accordance with embodiments of the present disclosure. In some embodiments, the memory sub-system controller 115 includes at least a portion of the Vpass adjustment component 113. In some embodiments, the Vpass adjustment component 113 is part of the host system 110, an application, or an operating system. In other embodiments, local media controller 135 includes at least a portion of Vpass adjustment component 113 and is configured to perform the functionality described herein.

In some embodiments, the Vpass adjustment component 113 can receive a request to perform a program operation (including a program phase and a program verify phase) on a set of memory cells that are associated with a wordline of a memory device. The Vpass adjustment component 113 can determine whether the memory device in which the wordline is a memory device that has both defective and functional decks. In response to determining that the memory device in which the wordline is a memory device having both defective and functional decks, the Vpass adjustment component 113 can determine that the memory device is a type of the memory device where at least one defective deck is physically disposed below at least one functional deck. In response to determining that memory device is a type of the memory device where at least one defective deck is physically disposed below at least one functional deck, the Vpass adjustment component 113 can perform the program operation on the set of memory cells connected to the wordline using a PV pass voltage, where the PV pass voltage is lower than a default PV pass voltage. The Vpass adjustment component 113 can retrieve the PV pass voltage using a data structure stored on the memory device that associates respective wordlines in entries of the data structure. In some embodiments, the PV pass voltage can be predetermined at manufacturing of the memory device based on offline testing and media characterization of the memory device under various testing conditions. In some embodiments, the PV pass voltage can be determined during the lifetime usage of the memory device based on online testing and media characterization of the memory device under various testing conditions. Further details regarding the operations of the Vpass adjustment component 113 will be described below with reference to FIGS. 2-8.

It will be appreciated by those skilled in the art that additional circuitry and signals can be provided, and that the components of FIG. 1 have been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Figure 2:
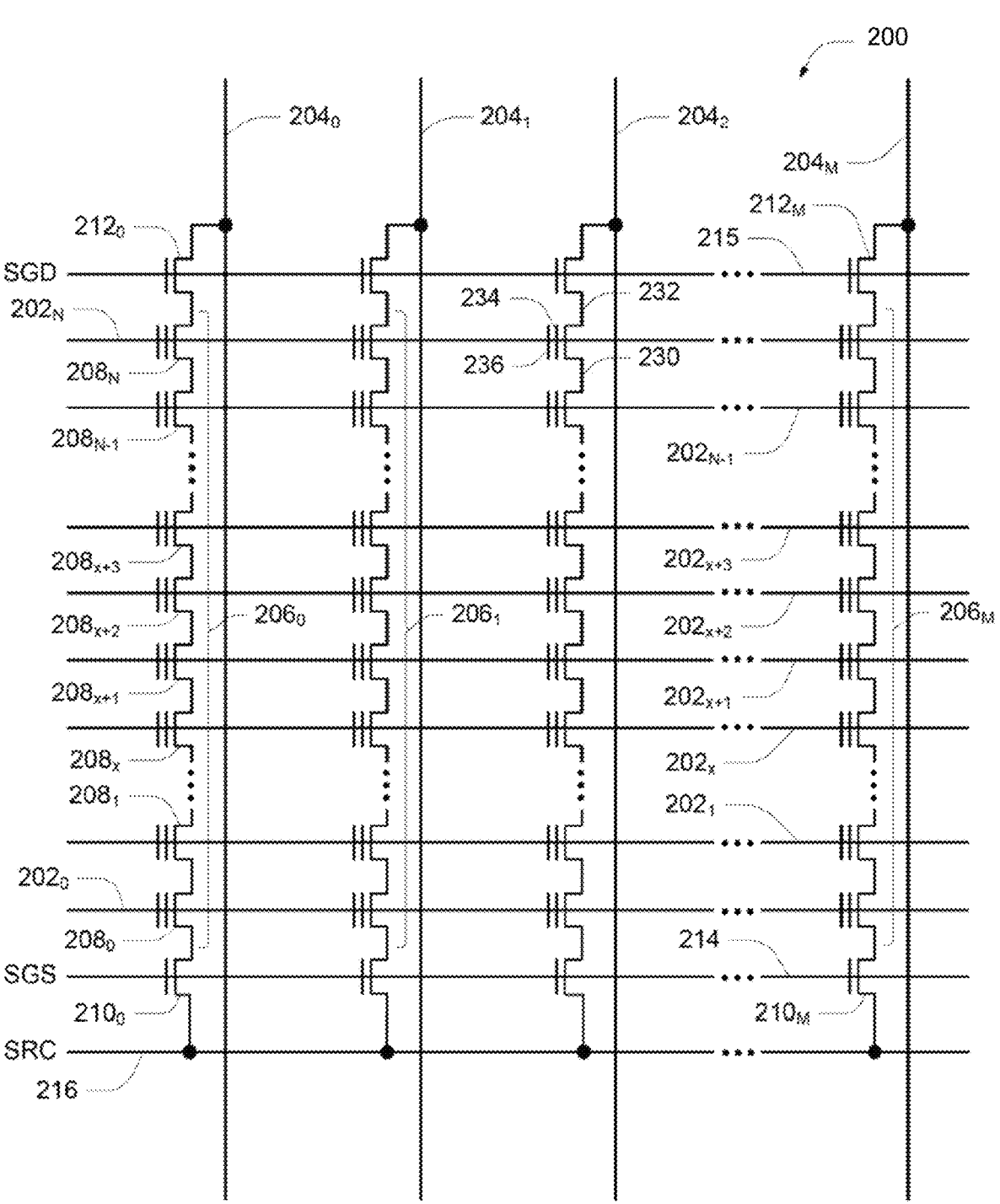
FIG. 2 is a schematic of portions of an array of memory cells as could be used in a memory device, in accordance with some embodiments of the present disclosure.

FIG. 2 is a schematic of portions of an array 200 of memory cells as could be used in a memory of the type described with reference to FIG. 1 according to an embodiment. Memory array 200 includes access lines, such as word lines $202_0$ to $202_N$, and data lines, such as bitlines $204_0$ to $204_M$. The wordlines 202 can be connected to global access lines (e.g., global word lines), not shown in FIG. 2, in a many-to-one relationship. For some embodiments, memory array 200 can be formed over a semiconductor that, for example, can be conductively doped to have a conductivity type, such as a p-type conductivity, e.g., to form a p-well, or an n-type conductivity, e.g., to form an n-well.

The memory array 200 can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216, or SRC. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200 in FIG. 2 can be a quasi-two-dimensional memory array and can have a generally planar structure, e.g., where the common source 216, NAND strings 206 and bit lines 204 extend in substantially parallel planes. Alternatively, the memory array 200 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, or the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 200 can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single program operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figures 3A, 3B:
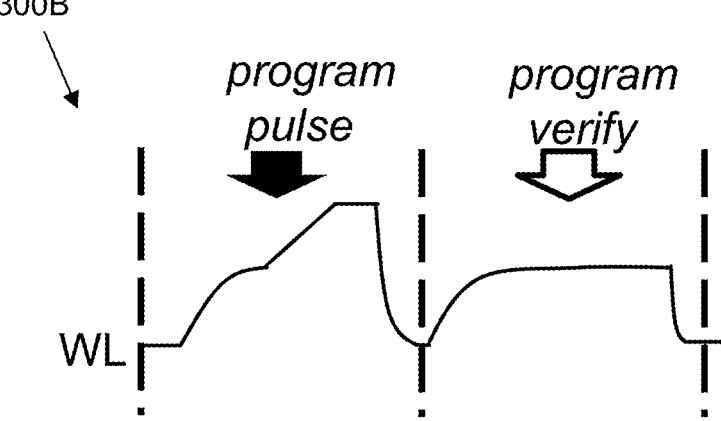
FIG. 3A is a diagram of an example adjustment table of a memory device, in accordance with some embodiments of the present disclosure.
FIG. 3B is a signal diagram illustrating example signals applied to a memory array during a program operation, in accordance with some embodiments of the present disclosure.

FIG. 3A illustrates a diagram of an example adjustment table of a memory device, in accordance with some embodiments of the present disclosure. As illustrated in FIG. 3A, an adjustment table can be stored in a memory device (e.g., the memory device 130 of FIG. 1) and can be used in implementing adaptive adjustment of pass voltage applied during the program verify phase of a program operation for wordlines in a memory sub-system (e.g., the memory sub-system 110 of FIG. 1). In some embodiments, the adjustment table can be any data structure that can store information. The adjustment table can include an entry for a wordline 301 and a corresponding pass voltage applied during the program verify phase PV Vpass 310. Each entry can have one or more corresponding parameters and notes (e.g., annotations, comments, other relevant data, etc.) associated with it. For example, each entry may include one or more of: a block ID 302, a block indicator 303, a deck ID 304, a deck indicator 305, or an adjustment indicator 306.

A block ID 302 may correspond to a block in which the wordline 301 is disposed. A block indicator 303 may indicate whether the block in which the wordline 301 is disposed is a full block (FB), a half good block (HGB), a type-I HGB (HGB1), a type-II HGB (HGB2), or a defective block (DB). A deck ID 304 may correspond to a deck in which the wordline 301 is disposed. A block indicator 305 may indicate whether the deck in which the wordline 301 is disposed is a functional deck (FD) or a defective deck (DD). An adjustment indicator 306 may indicate whether to adjust PV Vpass (e.g., Yes (Y) or No (N)), i.e., whether to use a lower pass voltage (e.g., V1, V2) or a default pass voltage (e.g., V0) applied during the program verify phase. The pass voltage applied during the program verify phase PV Vpass 310 can be predetermined at manufacturing of the memory device based on offline testing and media characterization of the memory device under various testing conditions.

FIG. 3B illustrates example signals in a program operation in accordance with some embodiments of the present disclosure. During each program operation to a different wordline a program pulse is generated to program the wordline followed by a separate program verify operation to verify the threshold voltages of the programmed cells of that wordline. The program operation may include a series of operations, for example, including starting a program operation with some hardware initialization, performing a seed operation in which cells of the wordline are preconditioned to a particular voltage, causing a pulse to program the wordline, performing a wordline/bitline recovery of the sub-block, performing a program verify operation to check whether the sub-block has been programmed to a particular threshold program verify voltage, perform a final verification operation to determine whether the programming has completed, and ending the program operation.

In some embodiments, the memory cells are grouped into blocks, which can be further divided into sub-blocks, where a given wordline is shared across a number of sub-blocks. In one embodiment, each sub-block corresponds to a separate plane in the memory array 200. The group of memory cells associated with a wordline within a sub-block is referred to as a physical page. Each physical page in one of the sub-blocks can be one of multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). In some embodiments, a physical page formed from memory cells of the QLC memory type can have a total of four logical pages, where each logical page can store data distinct from the data stored in the other logical pages associated with that physical page. Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible.

In one embodiment, to perform the program verify operation, the local media controller 135 causes a program verify voltage to be applied to the selected wordline, for example, for each pass, during the program verify phase of the program operation. In some embodiments, local media controller 135 can cause a single pulse having the program verify voltage level, according to PV Vpass in the table 300A, to be applied to the selected wordline.

Figure 4:
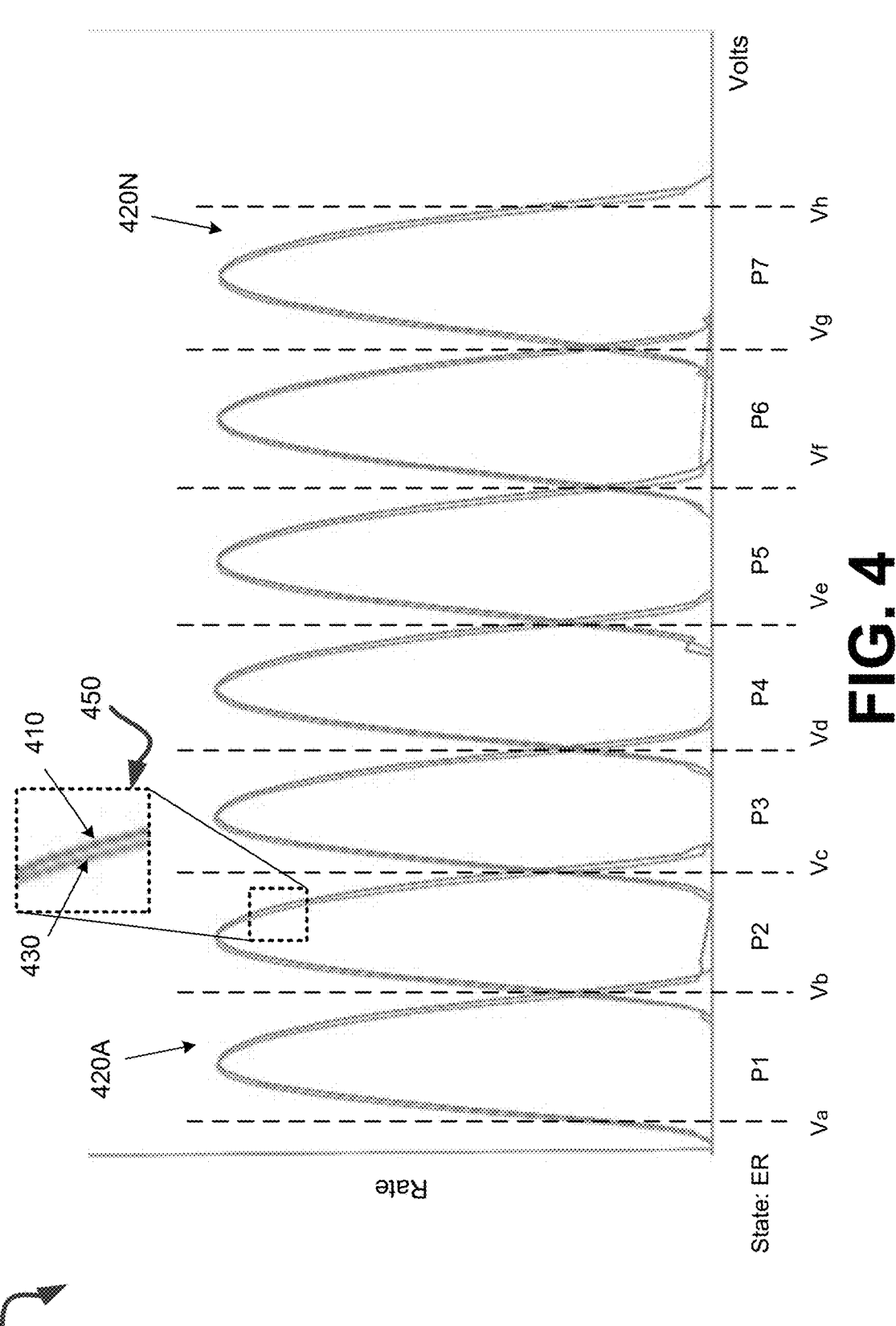
FIG. 4 schematically illustrates the threshold voltage distribution shift caused by the half good block compared with the full block exhibited by triple-level memory cells, in accordance with some embodiments of the present disclosure.

FIG. 4 schematically illustrates the threshold voltage distribution shift caused by the half good block compared with the full block exhibited by triple-level memory cells. While the illustrative example of FIG. 4 utilizes triple-level cells, the same observations can be made and, accordingly, the same remedial measures are applicable to single level cells and multi-level cells in order to compensate for the threshold voltage distribution shift.

A memory cell can be programmed (written to) by applying a certain voltage (e.g., program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Chart 400 illustrates program distributions 420A-420N (also referred to as "voltage distributions" or "distributions" or "programming distribution") of memory cells programmed by a respective write level (which can be assumed to be at the midpoint of the program distribution) to encode a corresponding logical level ("000" through "111" in case of a TLC). The program distributions 420A through 420N can illustrate the range of threshold voltages (e.g., normal distribution of threshold voltages) for memory cells programmed at respective write levels (e.g., program voltages). As shown, a triple-level memory cell can have seven program distributions (e.g., distribution 1 (420A), distribution 2 (420B) . . . distribution 7 (420N)). In order to distinguish between adjacent distributions (corresponding to two different logical levels), the read threshold voltage levels (shown by dashed vertical lines) are defined, such that any measured voltage that falls below a read threshold level is associated with one distribution of the pair of adjacent program distributions, while any measured voltage that is greater than or equal to the read threshold level is associated with another distribution of the pair of neighboring distributions.

In chart 400, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 420A-420N, respectively.

The enlarged picture 450 shows part of example distributions 410 (blue) and 430 (red), where distributions 410 (blue) reflects the distributions for a full block, and distributions 430 (red) reflects the distributions for a half good block. As seen from comparing example distributions 410 (blue) and 430 (red), the voltage distributions shift. In order to reduce the read bit error rate, the corresponding pass voltages applied during the program verify phase are adjusted to compensate for the shift in program distributions, which would make the distributions 410 (blue) and 430 (red) overlapped, that is, after the corresponding PV Vpass applies, the distribution 430 (red) moves to be overlapped with the distribution 410 (blue).

In some embodiments, the voltage distribution shift is tracked for each wordline, and based on the measurements on each wordline, the pass voltages applied during the program verify phase to the memory cells for the specific wordline are updated and applied during the program verify phase.

In some embodiments, the voltage distribution shift is selectively tracked for die groups based on measurements performed at one or more representative dice of the die group. Based on the measurements made on representative dice of a die group that characterize the voltage distribution shift, the pass voltages applied during the program verify phase to the memory cells for the dice of the die group are updated and are applied during the program verify phase.

FIG. 5 is a flow diagram of an example method 500 to implement adaptive adjustment of pass voltages applied during a program verify phase of a program operation for wordlines in a memory device having both defective and functional decks in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the Vpass adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a request to perform a program operation on a set of memory cells that are associated with a wordline of a memory device, such as memory device 130 of FIG. 1. In some embodiments, the request for a program operation can be received at a memory sub-system controller (e.g., the memory sub-system controller 115 of FIG. 1) from a host device (e.g., the host system 120 of FIG. 1). In some implementations, the wordline is disposed in a block that comprises one or more decks. In the method 500, the block can be replaced by any unit of the memory device that includes one or more decks.

At operation 520, the processing logic determines whether at least one first deck of the plurality of decks satisfies a criterion pertaining to a functionality of a deck and at least one second deck of the plurality of decks does not satisfy the criterion. The criterion pertaining to a functionality of a deck refers to a metric in a threshold value that represents the deck functions normally. A first deck satisfies the criterion means that the metric of the first deck satisfies the threshold value being function normally, and thus, the first deck represents a functional deck. A second deck does not satisfy the criterion means that the metric of the second deck does not satisfy the threshold value being function normally, and thus, the second deck represents a defective deck. That is, at operation 520, the processing logic determines whether the block in which the set of memory cells is disposed has at least one functional deck and at least one defective deck.

In some implementations, the processing logic determines whether the wordline is disposed on a HGB of the memory device. As described previously, HGB represents a block comprising at least one first deck (functional deck) and at least one second deck (defective deck), and the first deck satisfies a first criterion pertaining to a functionality of a deck and the second deck does not satisfy a second criterion pertaining to a functionality of a deck. The first criterion and the second criterion can be the same or different. For example, satisfying the first criterion may require that all or a certain number or percentage (e.g., 90%) of wordlines within the deck can be programmed and read within an error rate below a first threshold value, and not satisfying the second criterion may require that all or a certain number or percentage (e.g., 50%) of wordlines within the deck cannot be properly programed or can be read only with an error rate exceeding a second threshold value. In some implementations, each of the first criterion and the second criterion may vary based on the usage of the deck. For example, when a higher error rate is tolerable for a certain usage, the threshold value may be higher.

In some implementations, the processing logic may, based on identifying a physical and/or logical address of the wordline, to determine whether the wordline is disposed in a block that has at least one first deck that satisfies a criterion pertaining to a functionality of a deck and at least one second deck that does not satisfy the criterion.

For example, the processing logic can identify that the logical address of the wordline is $WL_3$. The processing logic can use a data structure, such as a mapping table, to identify a deck (and/or a block which the deck is disposed in) to which the wordline is mapped based on the address of the wordline. The data structure can list each wordline of the memory device in an entry and can list a corresponding deck (and/or a corresponding block) of the memory device on which the wordline is disposed in an associated (e.g., linked) entry. The data structure can list each deck of the memory device in an entry and can list a corresponding block of the memory device on which the deck is disposed in an associated (e.g., linked) entry. In some embodiments, the data structure can be preconfigured at manufacturing of the memory device. In some embodiments, the data structure can be stored on the memory device.

Then, the processing logic can determine whether the block (in which the deck is disposed) is a block that has at least one first deck that satisfies a criterion pertaining to a functionality of a deck and at least one second deck that does not satisfy the criterion. The processing logic can use another data structure, such as a table illustrated in FIG. 3A, to check an indicator that represents the block has at least one first deck that satisfies a criterion pertaining to a functionality of a deck and at least one second deck that does not satisfy the criterion (or an indicator that represents the block is an HGB). In some embodiments, the data structure for indicating can list each block of the memory device in an entry and can list in an associated entry an indicator (e.g., a bit flag) that the block has at least one first deck that satisfies a criterion pertaining to a functionality of a deck and at least one second deck that does not satisfy the criterion (or an indicator that represents the block is an HGB). In some embodiments, the data structure can be preconfigured at manufacturing of the memory device and modified during the usage of the memory device. In some embodiments, this data structure be determined during the lifetime usage of the memory device based on online testing and media characterization of the memory device under various testing conditions.

At operation 530, responsive to determining that at least one first deck of the plurality of decks satisfies a criterion pertaining to a functionality of a deck and at least one second deck of the plurality of decks does not satisfy the criterion, the processing logic determines whether there exits at least one second deck that is disposed below at least one first deck in the block. In some embodiments, determining whether at least one second deck is disposed below at least one first deck can include identifying the decks associated with a block (e.g., using a reference number associated with the block) in a data structure. In some embodiments, the data structure can list each deck of the memory device in an entry, and a corresponding block and a corresponding block indicator (e.g., a bit flag) indicating whether at least one second deck is disposed below the at least one first deck in the corresponding block (or an indicator that represent the block is an HGB1) in an associated (e.g., linked) entry. In some embodiments, the data structure can list each deck of the memory device in an entry, and a corresponding deck indicator indicating whether the deck is a functional deck or defective deck, and the processing logic identify the relative positions of the decks based on the physical addresses of the decks, and use the relative positions of the decks that is indicated as a functional deck or defective deck to determine whether the block that has at least one second deck disposed below at least one first deck. In some embodiments, the data structure can be preconfigured at manufacturing of the memory device and modified during the usage of the memory device. In some embodiments, the data structure can be stored on the memory device.

At operation 540, responsive to determining that the at least one second deck is disposed below the at least one first deck, the processing logic performs the program operation on the set of memory cells associated with the wordline using a first PV pass voltage, wherein the first PV pass voltage is lower than a default PV pass voltage.

The first PV pass voltage can correspond to (e.g., is unique to) the deck that the wordlines is disposed in. For example, the first PV pass voltage can be assigned to the particular deck due to certain physical characteristics of the deck. The memory sub-system controller can retrieve the first PV pass voltage using a data structure stored on the memory device that lists a respective deck disposed on a respective block in an entry and lists a specific first PV pass voltage in associated (e.g., linked) entries of the table. The data structure can be predetermined at manufacturing of the memory device based on offline testing and media characterization of the memory device under various testing conditions, or can be determined during the lifetime usage of the memory device based on online testing and media characterization of the memory device under various testing conditions. In some embodiments, the first PV pass voltage is determined according to a preset table that has a plurality of records, and each record of the plurality of records comprises a value of the first PV pass voltage corresponding to at least one of: a cell type (e.g., SLC, MLC, TLC, or QLC), a cell level (L1, L2, etc.), or a specific numbered wordline (WL1, WL2, etc.). For example, the value of the first PV pass voltage can be different with respect to various cell types, various cell levels, and/or various wordlines.

To perform the program operation on the set of cells associated with the wordline, the processing logic can perform a program phase of a program operation to program data to a set of memory cells. In one embodiment, the processing logic can cause a pulse having a program voltage level to be applied to the wordline, such as wordline of memory array 200 of memory device 130, as shown in FIG. 2.

The processing logic can initiate a program verify phase of the program operation. In one embodiment, the program verify phase is initiated in response to completion of the program phase. The processing logic can identify a set of memory cells that were programmed during the program phase of the program operation. The processing logic can cause a program verify voltage to be applied to the wordline during the program verify phase of the program operation. In one embodiment, as illustrated in FIG. 3B, the processing logic can cause a single pulse having the program verify voltage level to be applied to the wordline. The program verify voltage level has a lower magnitude than the default program verify voltage level.

After the processing logic completes the program operation including the program phase and the program verify phase, the processing logic can, for example, in response to a request to perform a read operation, perform the read operation on the set of cells associated with the wordline in the block using a default read pass voltage. As such, the adaptive adjustment of the PV pass voltage can avoid a read level adjustment solely for the purpose of compensating the half good block scenarios.

Figure 6:
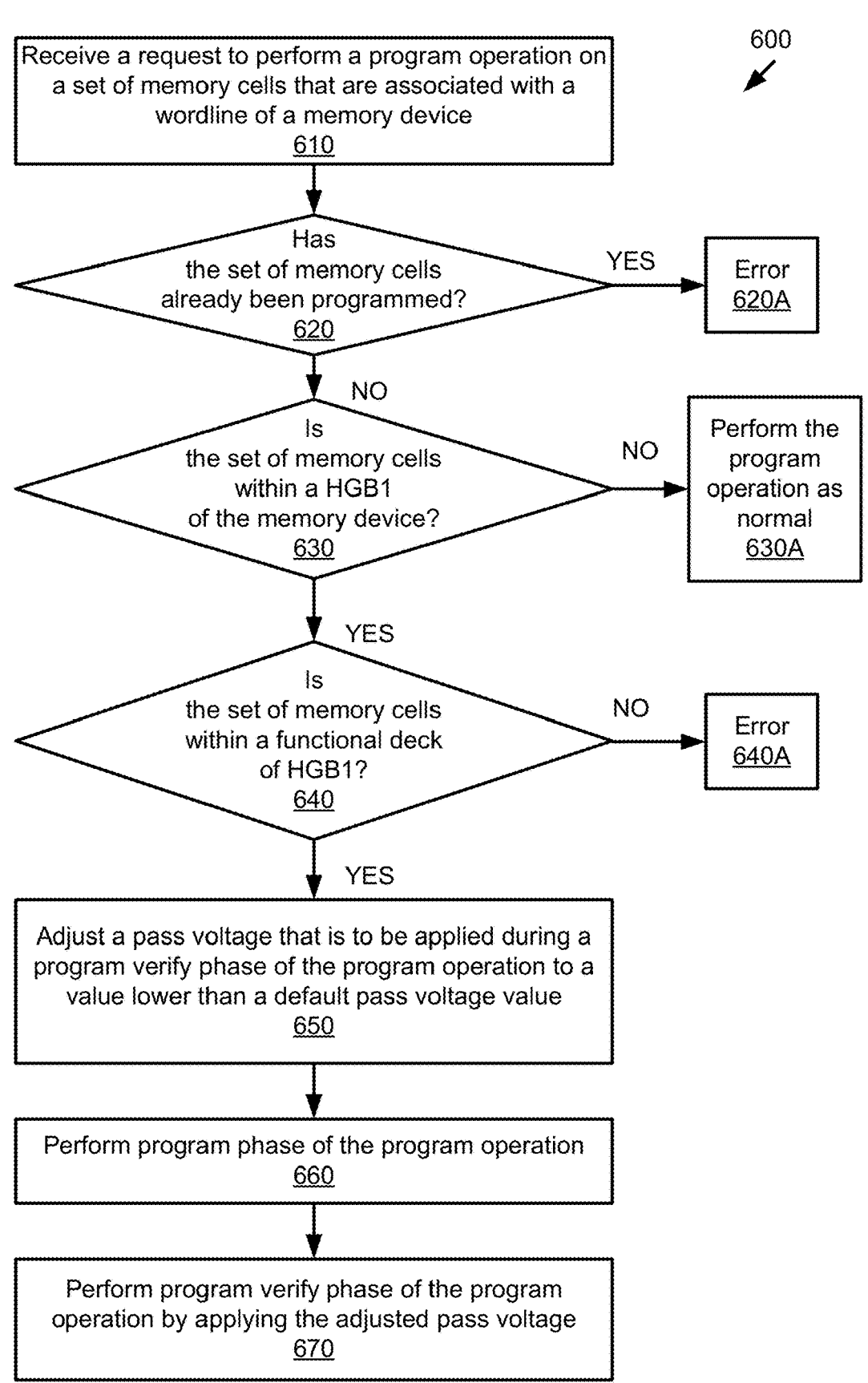

FIG. 6 is a flow diagram of an example method 600 to implement adaptive adjustment of pass voltages applied during a program verify phase of a program operation for wordlines in a memory device having both defective and functional decks in a memory sub-system, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the Vpass adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a request to perform a program operation on a set of memory cells that are associated with a wordline of a memory device, such as memory device 130 of FIG. 1. In some embodiments, operation 610 can be same as or similar to operation 510.

At operation 620, the processing logic checks whether the set of memory cells has already been programmed, i.e., any of the set of memory cells is not in an erase state. In some embodiments, the processing logic may determine the program/erase state of a memory cell by using a data structure, where the data structure includes the program/erase state data. In some embodiments, the processing logic may determine the program/erase state of a memory cell by using a sensing operation on the memory cell. Other methods for determining the program/erase state of a cell are also applicable here. At operation 620A, if the processing logic determines that the set of memory cell has already been programmed, the processing logic returns an error message in response to the request received at operation 610.

At operation 630, if the processing logic determines that the set of memory cell has not been programmed, the processing logic determines whether the set of memory cells, i.e., the wordline, is disposed in a HGB1. As described previously, HGB1 refers to a HGB where at least one defective deck would be programed after at least one functional deck being programmed, that is, in most cases, where at least one defective deck is physically disposed below at least one functional deck. In some embodiments, operation 630 can be same as or similar to a combination of operations 520 and 530. At operation 630A, if the processing logic determines that the set of memory cells, i.e., the wordline, is not disposed in a HGB1, the processing logic performs the program operation as normal, i.e., there is no adjustment to the pass voltage applied during the program verify phase.

At operation 640, if the processing logic determines that the set of memory cells, i.e., the wordline, is disposed in a HGB1, the processing logic determines whether the set of memory cells, i.e., the wordline, is disposed on a functional deck of the HGB1. As described previously, the functional deck refers to a deck that satisfies a criterion pertaining to a functionality of a deck, for example, a metric of the deck (e.g., an average RBER) does not exceed a threshold value that is considered as an indication of a functionality normality of the deck. That is, the processing logic checks whether the wordline is disposed in a functional deck, not in a defective deck that cannot be programmed. In some embodiments, the processing logic may use a data structure, for example, the deck indicator 305 illustrated in FIG. 3A, to determine whether the deck is functional or defective. At operation 640A, if the processing logic determines that the set of memory cells, i.e., the wordline, is not disposed on a functional deck of the HGB1, which means that the wordline cannot be programmed normally, the processing logic returns an error message in response to the request received at operation 610.

At operation 650, if the processing logic determines that the set of memory cells, i.e., the wordline, is disposed on a functional deck of the HGB1, the processing logic adjusts a pass voltage that is to be applied during a program verify phase of the program operation to a value lower than a default pass voltage value. In some embodiments, the value adjusted is obtained from a data structure, for example, an adjustment table in FIG. 3A. At operation 660, the processing logic performs the program phase of the program operations on the set of memory cells, and at operation 670, the processing logic performs the program verify phase of the program operation by applying the adjusted pass voltage. In some embodiments, the combination of operations 650-670 can be same as or similar to operation 540.

FIG. 7 is a flow diagram of an example method 700 to implement adaptive adjustment of pass voltages applied during a program verify phase of a program operation for wordlines in a memory device having both defective and functional decks in a memory sub-system, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the Vpass adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic receives a request to perform a program operation on a set of memory cells that are associated with a wordline of a memory device, such as memory device 130 of FIG. 1. In some embodiments, operation 610 can be same as or similar to operation 510.

At operation 720, the processing logic determines whether the set of memory cells can be programmed, which means that whether the set of memory cells functions normally and is in an erase state. In some embodiments, operation 720 can be the same as or similar to operations 620 and/or 640. At operation 720A, if the processing logic determines that the set of memory cell cannot be programmed, the processing logic returns an error message in response to the request received at operation 710.

At operation 730, if the processing logic determines that the set of memory cell can be programmed, the processing logic determines whether a PV pass voltage adjustment criterion is satisfied. In some embodiments, operation 730 can be same as or similar to a combination of operations 520 and 530. In some embodiments, operation 730 can be same as or similar to operation 630. At operation 730A, if the processing logic determines that the PV pass voltage adjustment criterion is not satisfied, the processing logic performs the program operation as normal, i.e., there is no adjustment to the pass voltage applied during the program verify phase.

At operation 740, if the processing logic determines that the PV pass voltage adjustment criterion is satisfied, the processing logic performs the program operation using a first pass voltage applied during the program verify phase of the program operation, wherein the first pass voltage has a value lower than a default pass voltage value. In some embodiments, operation 740 can be the same as or similar to operation 540.

Figure 8:
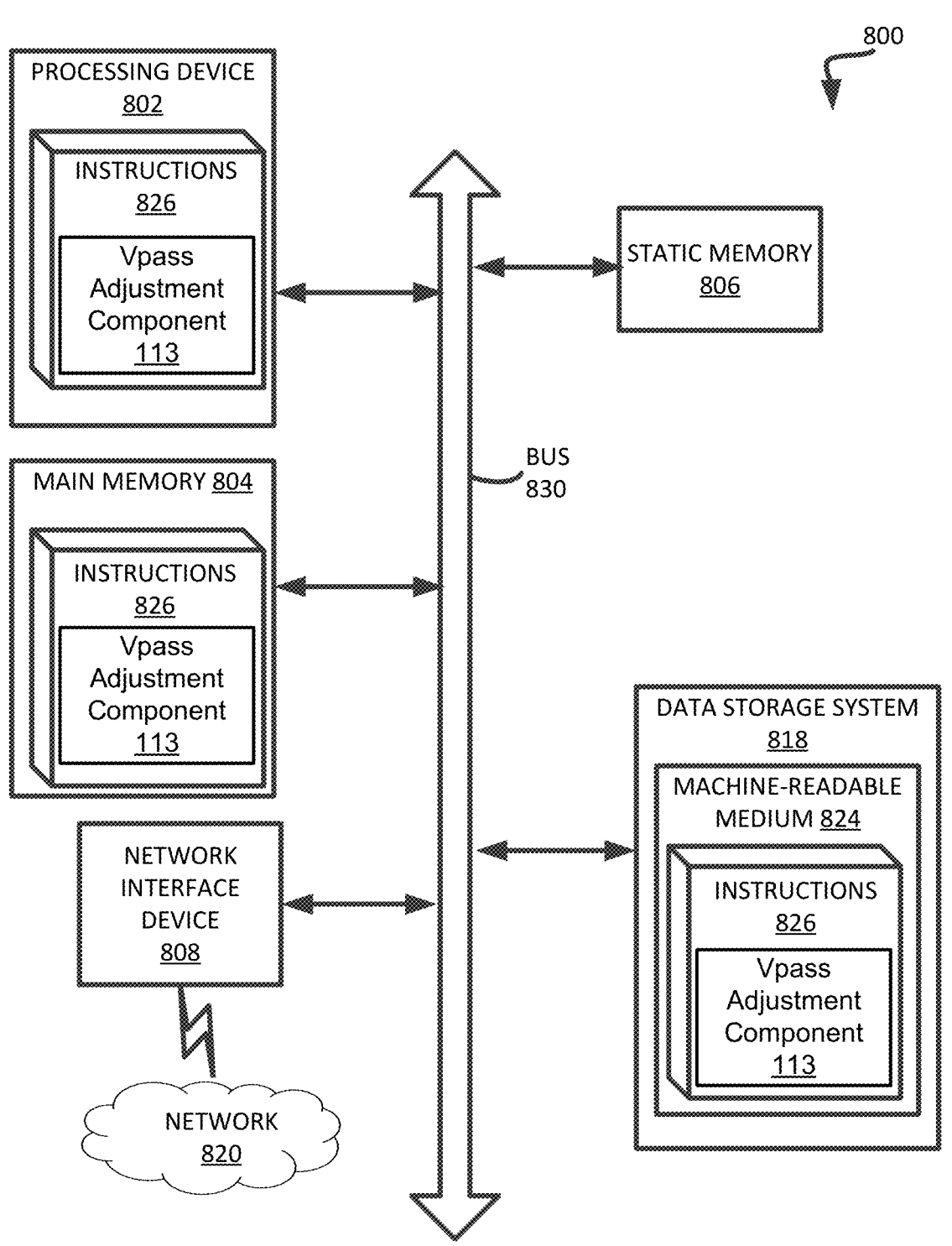
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the Vpass adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or RDRAM, etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to a component (e.g., Vpass adjustment component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
receiving a request to perform a program operation on a set of cells associated with a wordline in a block of the memory device, the block comprising a plurality of decks;
determining whether at least one second deck of the plurality of decks is physically disposed below at least one first deck of the plurality of decks, wherein the at least one first deck satisfies a criterion pertaining to a functionality of a deck, and the at least one second deck of the plurality of decks does not satisfy the criterion; and
responsive to determining that the at least one second deck is physically disposed below the at least one first deck, performing the program operation on the set of cells associated with the wordline in the block using a first pass voltage applied during a program verify phase, wherein the first pass voltage is lower than a default program verify pass voltage.

2. The system of claim 1, wherein the processing device is to perform operations further comprising:
performing a read operation on the set of cells associated with the wordline in the block using a default read pass voltage.

3. The system of claim 1, wherein the processing device is to perform operations further comprising:
responsive to determining that the at least one second deck is not physically disposed below the at least one first deck, performing the program operation on the set of cells associated with the wordline in the block using the default program verify pass voltage.

4. The system of claim 1, wherein the processing device is to perform operations further comprising:
determining whether the at least one first deck satisfies the criterion and the at least one second deck does not satisfy the criterion.

5. The system of claim 4, wherein the processing device is to perform operations further comprising:
responsive to determining that it is not that the at least one first deck satisfies the criterion and the at least one second deck does not satisfy the criterion, performing the program operation on the set of cells associated with the wordline in the block using the default program verify pass voltage.

6. The system of claim 1, wherein the first pass voltage is determined through a characterization measurement on the set of cells associated with the block.

7. The system of claim 1, wherein the first pass voltage is determined according to a preset table, wherein the preset table comprises a plurality of records, wherein each record of the plurality of records comprises a value of the first pass voltage corresponding to at least one of: a cell type, a level, or a numbered wordline.

8. The system of claim 1, wherein determining whether the at least one second deck is physically disposed below the at least one first deck further comprises:
determining whether the block is associated with an indicator according to a data structure.

9. The system of claim 1, wherein the processing device is to perform operations further comprising:
identifying the block based on an address of the wordline.

10. A method comprising:

receiving, by a processing device, a request to perform a program operation on a set of cells associated with a wordline in a block of a memory device, the block comprising a plurality of decks;

determining whether at least one second deck of the plurality of decks is physically disposed below at least one first deck of the plurality of decks, wherein the at least one first deck satisfies a criterion pertaining to a functionality of a deck, and the at least one second deck of the plurality of decks does not satisfy the criterion; and responsive to determining that the at least one second deck is physically disposed below the at least one first deck, performing the program operation on the set of cells associated with the wordline in the block using a first pass voltage applied during a program verify phase, wherein the first pass voltage is lower than a default program verify pass voltage.

11. The method of claim 10, further comprising:

performing a read operation on the set of cells associated with the wordline in the block using a default read pass voltage.

12. The method of claim 10, further comprising:

responsive to determining that the at least one second deck is not physically disposed below the at least one first deck, performing the program operation on the set of cells associated with the wordline in the block using the default program verify pass voltage.

13. The method of claim 10, further comprising:

determining whether the at least one first deck satisfies the criterion and the at least one second deck does not satisfy the criterion.

14. The method of claim 13, further comprising:

responsive to determining that it is not that the at least one first deck satisfies the criterion and the at least one second deck does not satisfy the criterion, performing the program operation on the set of cells associated with the wordline in the block using the default program verify pass voltage.

15. The method of claim 10, wherein the first pass voltage is determined through a characterization measurement on the set of cells associated with the block.

16. The method of claim 10, wherein the first pass voltage is determined according to a preset table, wherein the preset table comprises a plurality of records, wherein each record of the plurality of records comprises a value of the first pass voltage corresponding to at least one of: a cell type, a level, or a numbered wordline.

17. A non-transitory computer-readable storage medium comprising instructions that, when executed by a processing device, cause the processing device to perform operations comprising:

receiving a request to perform a program operation on a set of cells associated with a wordline in a block of a memory device, the block comprising a plurality of decks;

determining whether at least one second deck of the plurality of decks is physically disposed below at least one first deck of the plurality of decks, wherein the at least one first deck satisfies a criterion pertaining to a functionality of a deck, and the at least one second deck of the plurality of decks does not satisfy the criterion; and responsive to determining that the at least one second deck is physically disposed below the at least one first deck, performing the program operation on the set of cells associated with the wordline in the block using a first pass voltage applied during a program verify phase, wherein the first pass voltage is lower than a default program verify pass voltage.

18. The non-transitory computer-readable storage medium of claim 17, wherein the first pass voltage is determined through a characterization measurement on the set of cells associated with the block.

19. The non-transitory computer-readable storage medium of claim 17, wherein the first pass voltage is determined according to a preset table, wherein the preset table comprises a plurality of records, wherein each record of the plurality of records comprises a value of the first pass voltage corresponding to at least one of: a cell type, a level, or a numbered wordline.

20. The non-transitory computer-readable storage medium of claim 17, wherein the processing device is to perform operations further comprising:

responsive to determining that the at least one second deck is not physically disposed below the at least one first deck, performing the program operation on the set of cells associated with the wordline in the block using the default program verify pass voltage.

\*    \*    \*    \*    \*